United States Patent
Zhou et al.

(10) Patent No.: US 9,431,436 B2
(45) Date of Patent: Aug. 30, 2016

(54) ARRAY SUBSTRATE AND MANUFACTURING METHOD THEREOF

(75) Inventors: Weifeng Zhou, Beijing (CN); Jian Guo, Beijing (CN); Xing Ming, Beijing (CN)

(73) Assignee: BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 1423 days.

(21) Appl. No.: 12/888,144

(22) Filed: Sep. 22, 2010

(65) Prior Publication Data

US 2011/0074663 A1   Mar. 31, 2011

(30) Foreign Application Priority Data

Sep. 25, 2009 (CN) .......................... 2009 1 0093196

(51) Int. Cl.
   H01L 27/12   (2006.01)
   G02F 1/1368  (2006.01)
   G02F 1/1362  (2006.01)

(52) U.S. Cl.
   CPC ......... *H01L 27/1288* (2013.01); *H01L 27/124* (2013.01); *G02F 1/1368* (2013.01); *G02F 2001/136236* (2013.01)

(58) Field of Classification Search
   CPC .................................................. G03F 7/70283
   See application file for complete search history.

(56) References Cited

U.S. PATENT DOCUMENTS

| | | | |
|---|---|---|---|
| 6,414,730 B1 * | 7/2002 | Akamatsu et al. | 349/43 |
| 6,746,887 B1 * | 6/2004 | Moon et al. | 438/30 |
| 6,888,586 B2 * | 5/2005 | Yoo et al. | 349/43 |
| 6,992,732 B2 * | 1/2006 | Kim et al. | 349/43 |
| 7,019,797 B2 * | 3/2006 | Choi et al. | 349/43 |
| 7,265,799 B2 * | 9/2007 | Souk et al. | 349/43 |
| 7,279,370 B2 * | 10/2007 | Lim et al. | 438/155 |
| 7,294,855 B2 * | 11/2007 | Baek et al. | 257/72 |
| 7,303,987 B2 * | 12/2007 | Lim | G02F 1/13458 257/758 |
| 7,518,666 B2 * | 4/2009 | Jung et al. | 349/43 |
| 7,737,446 B2 * | 6/2010 | Park | 257/72 |
| 2002/0109799 A1 * | 8/2002 | Choi et al. | 349/43 |
| 2004/0041149 A1 * | 3/2004 | Baek et al. | 257/49 |
| 2004/0183955 A1 * | 9/2004 | Souk et al. | 349/43 |
| 2005/0263769 A1 * | 12/2005 | Chul Ahn | 257/72 |
| 2007/0259289 A1 * | 11/2007 | Park et al. | 430/311 |
| 2010/0173433 A1 * | 7/2010 | Park et al. | 438/27 |
| 2011/0068341 A1 * | 3/2011 | Li et al. | 257/59 |

FOREIGN PATENT DOCUMENTS

CN   1702530 A      11/2005
CN   101718950 A *  6/2010  ......... H01L 21/0272

* cited by examiner

*Primary Examiner* — Edward Glick
*Assistant Examiner* — Anthony G Quash
(74) *Attorney, Agent, or Firm* — Ladas & Parry LLP

(57) ABSTRACT

A method of manufacturing an array substrate is disclosed. A first conductive pattern, a first insulating layer, a second conductive pattern, and a second insulating layer on a base substrate is successively formed. The second insulating layer and the first insulating layer are patterned with a double-tone mask. At least a half lap joint via hole in the second insulating layer, and at least a full lap joint via hole in both the first insulating layer and the second insulating layer is formed. The second conductive pattern corresponds to a part of the half lap joint via hole, and the first conductive pattern corresponds to the whole of the full lap joint via hole. A third conductivity pattern is formed on the surface of the second conductivity pattern and the first insulating layer and a fourth conductive pattern is formed on the surface of the first conductive pattern.

6 Claims, 5 Drawing Sheets

ARRAY SUBSTRATE AND MANUFACTURING METHOD THEREOF

BACKGROUND

Embodiments of the invention relates to an array substrate and the manufacturing method thereof.

The technology of TFT-LCDs (Thin Film Transistor Liquid Crystal Displays) has been advancing rapidly during the past ten year; significant progresses have been made with respect to screen size and displaying quality, which puts TFT-LCDs in the trend of replacing CRTs.

The aperture ratio is an important factor of increasing LCD luminance and reducing power consumption; and using via holes of a half lap joint structure is one method of increasing the aperture ratio.

FIG. 1 is the schematic top view showing part of a traditional substrate. FIG. 2 is the side view of the section taken along A-A of FIG. 1.

As shown in FIG. 1 and FIG. 2, the array substrate comprises a base substrate 1, on which is formed a pattern comprising data lines 3 and gate lines 2 that crisscross one another, thus defining a plurality of pixel units. Beyond the area of the pixel units is the peripheral area, in which is formed the pattern of pad regions (interface regions), i.e., the data line pad regions 15 and the gate line pad regions 10 for respectively connecting the data lines 3 and the gate lines 2 to external driving circuits. In each pixel unit is provided a TFT switch and a pixel electrode 13; in particular the TFT switch comprises a gate electrode 4, an active layer 6, a source electrode 7, a drain electrode 8, and etc. Conductive patterns are kept insulated from each other by insulating materials. For example, the gate electrode 4 and the gate line 2 are covered by a gate insulating layer 5; and the data line 3, the active layer 6, the source electrode 7, and the drain electrode 8 are covered by a passivation layer 9. The pixel electrode 13 is connected with the drain electrode 8 via a drain electrode via hole in the passivation layer 9. To increase the aperture ratio of the pixel unit, the traditional half lap joint structure is used, in which the area of the drain electrode 8 is reduced, and the drain electrode via hole is provided on the edge of the drain electrode 8, i.e., a half of the drain electrode via hole is disposed on the edge of the drain electrode 8, and thus the via hole of the drain electrode 8 can also be referred to as the half lap joint via hole 11. In such a way, in the pixel electrode, part of the pixel electrode 13 is joined to the drain electrode 8, as shown in FIG. 1 and FIG. 2. It is usually necessary to provide a pad region via hole for a pad region, the material for the pixel electrode 13 is usually filled in the pad region, so as to protect the metal material of the pad region. The data line pad region 15 and the gate line pad region 10 do not have the issue regarding aperture ratio, the via holes in the data line pad region 15 and the gate line pad region 10 usually do not use the half lap joint structure, and thus they can be referred to as the full lap joint via holes 12.

The traditional manufacturing method, by using a mask, employs a method of continuously dry-etching the corresponding positions in the pixel unit after a full exposure to make the half lap joint via hole; the half lap joint structure is formed after the pixel electrode film is deposited.

It has been found that the above technique has the following defects: at the half lap joint structure, due to the dry etching, some of the gate scanning layer 5 below the drain electrode 8 is also etched away, which forms a cavity, as shown by the dashed circle area in FIG. 2. The cavity renders the structure vulnerable to layer discontinuity during deposing the pixel electrode 13 in the subsequent steps; and it renders the orientations of liquid crystal molecules near the cavity vulnerable to unpredictable deflections, which leads to light leakage. Moreover, the dangling part of the drain electrode 8 over the cavity is likely to fall off due to the later rubbing process, which forms impurity particles that adversely affect the displaying effect.

SUMMARY

An embodiment provides a method of manufacturing an array substrate, comprising steps of: forming at least a first conductive pattern on a base substrate; forming a first insulating layer on the base substrate with the first conductive pattern formed thereon; forming at least a second conductive pattern on the first insulating layer; forming a second insulating layer on the base substrate with the second conductive pattern formed thereon; patterning the second insulating layer and the first insulating layer with a double-tone mask, forming at least a half lap joint via hole in the second insulating layer, and forming at least a full lap joint via hole in both the first insulating layer and the second insulating layer, wherein the second conductive pattern corresponds to a part of the half lap joint via hole, and the first conductive pattern corresponds to the whole of the full lap joint via hole; and forming at least a third conductive pattern and a fourth conductive pattern on the base substrate with the half lap joint via hole and the full lap joint via hole formed thereon, wherein the third conductivity pattern is formed on the surface of the second conductivity pattern and the first insulating layer through the half lap joint via hole, and the fourth conductive pattern is formed on the surface of the first conductive pattern through the full lap joint via hole.

Another embodiment of the invention provides an array substrate that is made by the above manufacturing method.

Still another embodiment of the invention provides an array substrate, comprising a base substrate with a plurality of pixel units formed on the base substrate, wherein at least a first conductive pattern is formed on the base substrate and is covered by a first insulating layer, at least a second conductive pattern is formed on the first insulating layer and is covered by a second insulating layer, at least a third conductive pattern and a fourth conductive pattern are formed on the second insulating layer, at least a half lap joint via hole is formed in the second insulating layer, and at least a full lap joint via hole is formed in the first insulating layer and the second insulating layer, the second conductive pattern corresponds to a part of the half lap joint via hole, the first conductive pattern corresponds to the whole of the full lap joint via hole; the third conductivity pattern is formed on the surface of the second conductivity pattern and the first insulating layer through the half lap joint via hole, and the fourth conductive pattern is formed on the surface of the first conductive pattern through the full lap joint via hole.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION

Figure 1:
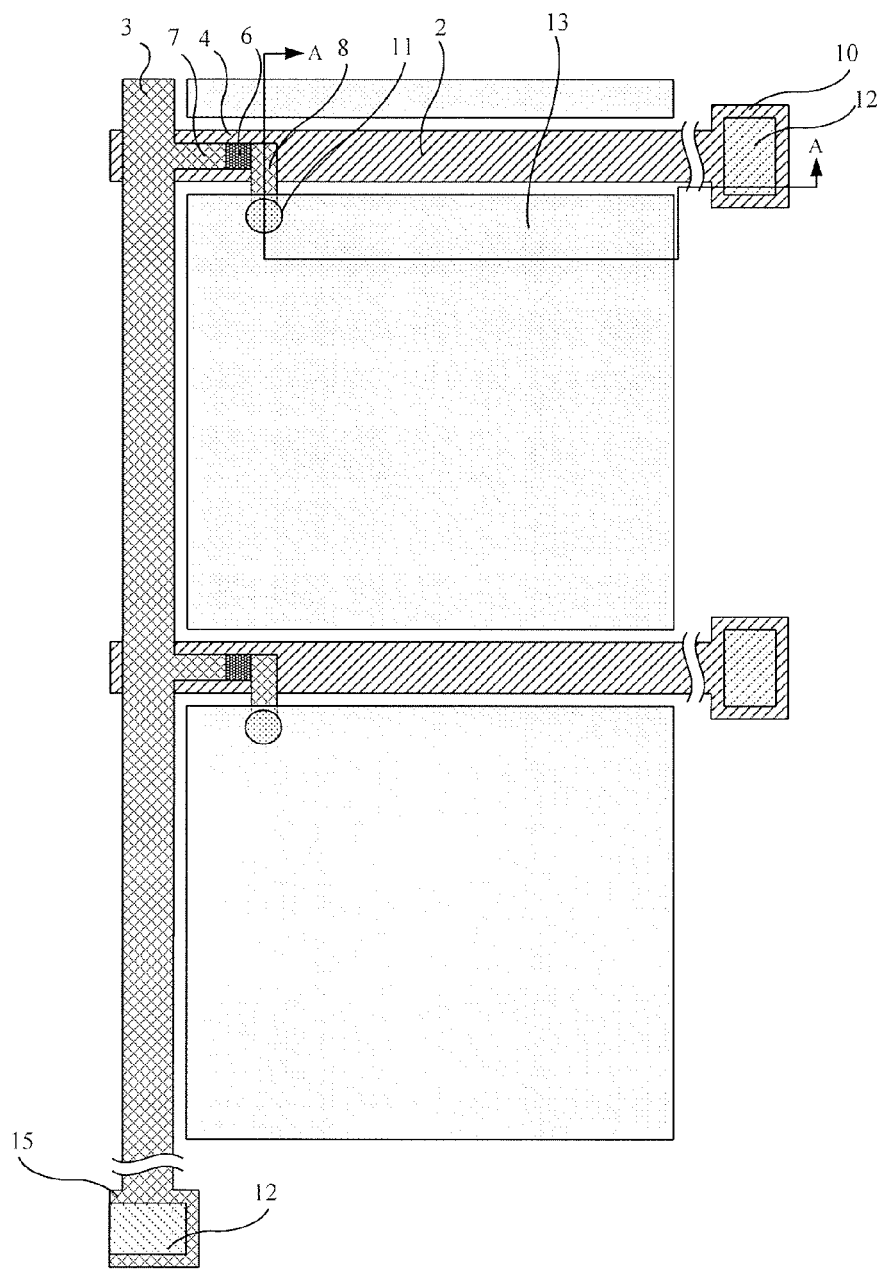
FIG. 1 is a schematic top view showing part of a traditional substrate.
Figure 2:
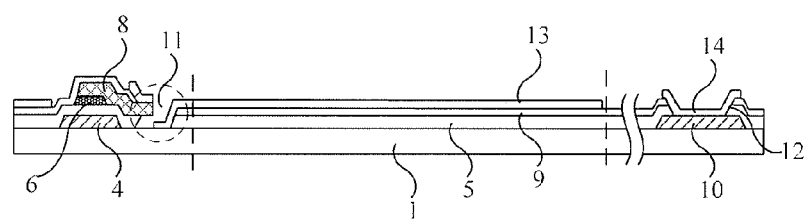
FIG. 2 is a side view of the section taken along A-A of FIG. 1.

In this disclosure, a double-tone mask comprises an opaque region and a transparent region, like a normal mask, and further comprises a partial transparent region. A photoresist layer can be formed into an non-exposed region, a partially exposed region and a completely exposed region after being exposed with the double-tone mask, and these regions have different thickness after development. Examples of a double-tone mask comprise a gray tone mask or a half tone mask. A gray tone mask employs a kind of partial transparent material to form the partial transparent region, and a half tone mask employs a slit or slits to fount the partial transparent region with optical diffraction of the slit or slits.

An embodiment of the invention provides a method of manufacturing an array substrate, comprising the following steps: forming at least a first conductive pattern on a base substrate; forming a first insulating layer on the base substrate with the first conductive pattern formed thereon; forming at least a second conductive pattern on the first insulating layer; forming a second insulating layer on the base substrate with the second conductive pattern formed thereon; patterning the second insulating layer and the first insulating layer with a double-tone mask, forming at least a half lap joint via hole in the second insulating layer, and forming at least a full lap joint via hole in both the first insulating layer and the second insulating layer, wherein the second conductive pattern corresponds to a part of the half lap joint via hole, and the first conductive pattern corresponds to the whole of the full lap joint via hole; and forming at least a third conductive pattern and a fourth conductive pattern, wherein the third conductivity pattern is formed on the surface of the second conductivity pattern and the first insulating layer through the half lap joint via hole, and the fourth conductive pattern is formed on the surface of the first conductive pattern through the full lap joint via hole.

In the embodiment, with the half-exposing patterning process, the half lap joint via hole and the full lap joint via hole can be formed after two separate etching processes.

Because the thickness of the insulating material to be etched away is different for the half lap joint via hole and for the full lap joint via hole, the two separate etching processes render it possible to assure that the part of the insulating material beneath the second conductive pattern that corresponds to the half lap joint via hole is not etched, and thus the first insulating layer under the half lap joint via hole is retained and no cavity is formed below the second conductive pattern, which can solve the problem such as layer discontinuity and impurity particles caused by the cavities in the half lap joint structure.

The above embodiment can apply to all the cases where it is necessary to form half lap joint via holes and full lap joint via holes in one patterning process. For example, forming the first conductive pattern on a base substrate can be forming the patterns of the gate line pad regions; forming the second conductive pattern can be forming the patterns of drain electrodes, data line pad regions and/or data lines that are provided at intervals; forming the third conductive pattern can be forming the pattern of pixel electrodes, data line pad region connection lines and/or data line bridging lines; forming the fourth conductive pattern can be forming the pattern of the connection lines for the gate line pad regions. Pixel electrodes can be formed on the surface of the drain electrodes and the first insulating layer through the half lap joint via holes, the data line pad region connection lines can be formed on the surface of the data line pad regions and the first insulating layer, or the data line bridging lines can be formed on the surface of the data lines that are provided at intervals and the first insulating layer through the half lap joint via holes, while the connection lines for the gate scanning pad regions can be formed on the surface of the gate line pad regions through the full lap joint via holes.

The data line pad regions and the data lines can also have the full lap joint structure. The full lap joint structure, having a large contact area, can give good effect of lap-joining. However the half lap joint structure can be used instead in the case of the requirement such as reducing the contact area. According to different requirements in design, there may be case where the data lines are provided at intervals and connected by the data line bridging lines in another layer. The data line bridging lines can be used to connect the circuits in the second conductive layer that are provided at intervals or to connect the circuits in the second conductive layer and those in the first conductive layer. The bridging lines for data lines can be made of the transparent material for the pixel electrodes and are used to connect the data lines that are provided at intervals. Similarly, the bridging lines are not limited for connecting data lines, and they can also be used in other cases where bridging connections are needed.

Regarding the full lap joint structure of the data line pad region, the data line pad region is also formed when the pixel electrode and/or the data lines provided at intervals are formed.

A full lap joint via hole is also formed in the second insulating layer when patterning the second insulating layer and the first insulating layer with a double-tone mask, and the data line pad region corresponds to the full lap joint via hole.

A data line pad region connecting line also formed when forming the third conductive patterns and the fourth conductive pattern on the base substrate with the above patterns formed thereon, and the data line pad region connection line is foil led on the surface of the data line pad region through the full lap joint via hole.

As to the full lap joint structure for one data line, it is formed by a method similar to that for the full lap joint structure of the data line pad region.

The process of distributed etching with a double-tone mask has many ways, and the methods to form the half lap joint structures for the bridging lines, for the connection lines in the pad regions, and for the drain electrodes are similar. Hereinafter, a detailed description is further given with references to specific embodiments and drawings, and the half lap joint structure of the via holes for the drain electrodes is taken as the example.

First Embodiment

The method of manufacturing an array substrate according to the first embodiment comprises the following steps:

Step 100, forming a pattern of a gate line pad region 10 on a base substrate 1, wherein the gate line pad region 10 is usually formed at the same time as patterns of a gate line 2 and a gate electrode 4 are formed.

Step 200, depositing a first insulating layer on the base substrate 1, wherein the first insulating layer is usually referred to as the gate insulating layer 5.

Step 300, forming a pattern of a drain electrode 8 on the base substrate 1 with the above patterns formed thereon, wherein in this step the patterns of an active layer 6, a data line 3, a source electrode 7, and etc. are also formed in the same time as the pattern of the drain electrode 8 is formed.

Figure 3:
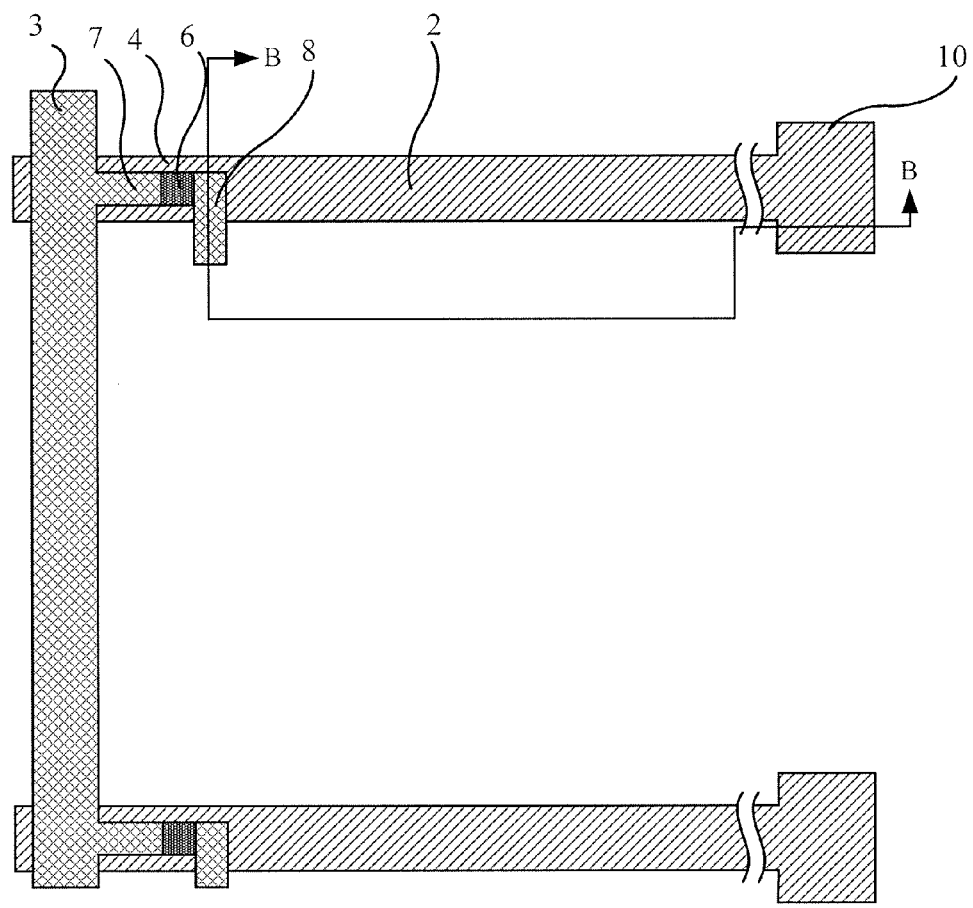
FIG. 3 is a schematic top view showing part of the array substrate produce by a first embodiment of the invention.
Figure 4:
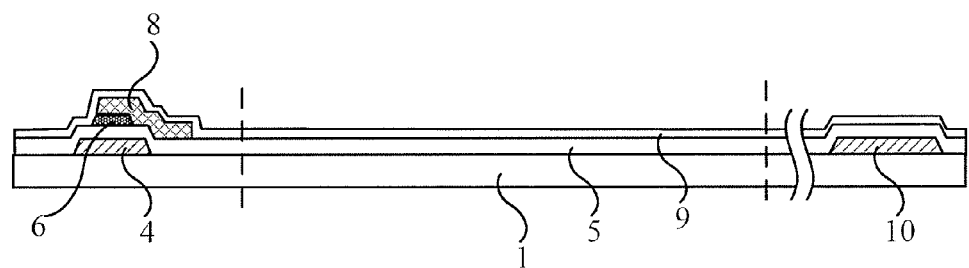
FIG. 4 is a side view of the section taken along B-B of FIG. 1.

Step 400, depositing a second insulating layer on the base substrate 1 with the above patterns formed thereon, wherein the second insulating layer is usually referred to as the passivation layer 9, as shown in FIG. 3 and FIG. 4.

Step 501, applying a photoresist layer 40 on the passivation layer 9.

Figure 5:
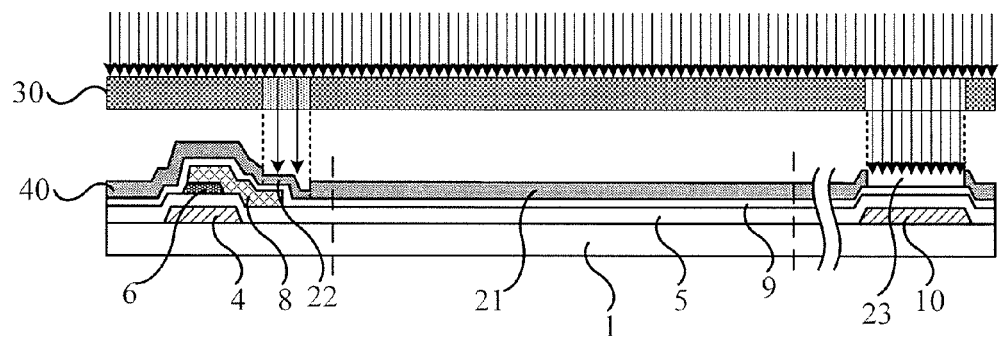
FIG. 5 is a first side view of a section of the array substrate produce by the first embodiment of the invention.
Figure 6:
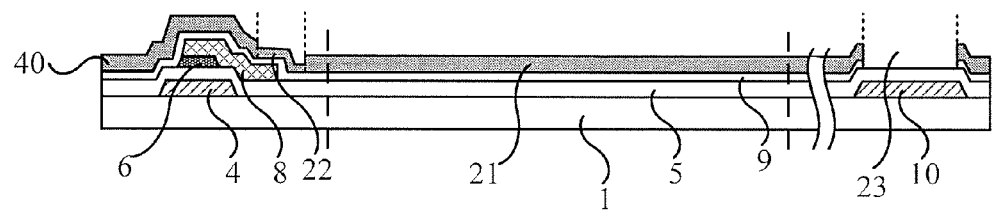
FIG. 6 is a second side view of a section of the array substrate produce by the first embodiment of the invention.

Step 502, exposing and developing the photoresist 40 with a double-tone mask 30, so as to form a pattern of the photoresist layer 40, which comprises a fully retained region 21, a partially retained region 22, and a completely removed region 23. The double-tone mask 30 can be a half tone mask or a grey tone mask. After UV exposing and developing, the photoresist layer 40 is formed into the three regions. The fully retained region 21 is the region where the photoresist layer 40 is fully retained after the development; the partially retained region 22 is the region where part of the photoresist layer 40 is retained after the development, its thickness is smaller than that of the photoresist layer 40 in the fully retained region 21; and the photoresist layer 40 in the completely removed region 23 is completely removed. The partially retained region 22 corresponds to the half lap joint via hole 11; the completely removed region 23 corresponds to the full lap joint via hole 12; and the fully retained region 21 corresponds to the region the completely removed region 23 and the partially retained region 22, as shown in FIG. 5;

Step 503, performing a first etching to etch away at least the part of passivation that corresponds to the completely removed region 23, wherein the first etching can be a dray etching process, the thickness of the insulating material etched away can be controlled by controlling the time of the dry etching. Here, it is enough to control the etching time to merely etch away the passivation layer 9, as shown in FIG. 6. In this step, it is also feasible to perform a complete etching to form the full lap joint via hole 12, but it is preferable to etch away the thickness of the passivation layer 9 only. On one hand, this can save the etching time; on the other hand, it is helpful to avoid etching the exposed gate line pad region 10 during next etching. Etching for a long period of time harms metal material, even though dry etching has less significant effect on metal materials;

Step 504, ashing the photoresist layer 40 in accordance with the thickness of the photoresist in the partially retained region 22, so that the photoresist layer 40 in the partially retained region 22 is completely removed and a part of the thickness of the photoresist layer 40 in the fully retained region 21 still remains.

Figure 7:
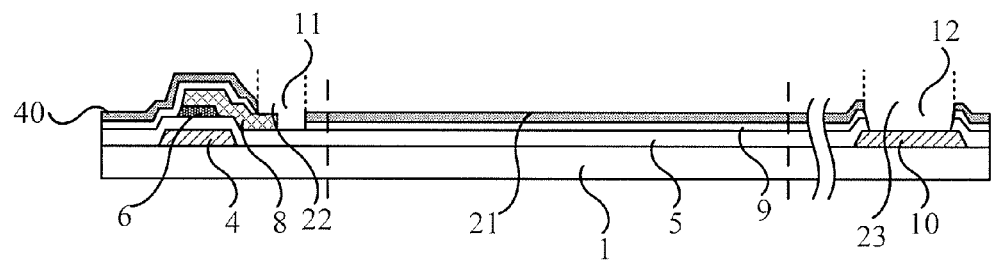
FIG. 7 is a third side view of a section of the array substrate produce by the first embodiment of the invention.

Step 505, performing a second etching to etch away the part of the passivation layer 9 corresponding to the partially retained region 22 and etch away the part of the gate insulating layer 5 corresponding to the completely removed region 23, so as to form the half lap joint via hole 11 and the full lap joint via hole 12, wherein the second etching can be dray etching, it is feasible to perform over-etching for a certain period of time to assure that the insulating material at the full lap joint via hole 12 be completely etched away, as shown in FIG. 7 and the top view of FIG. 1.

Removing the photoresist layer 40 after the above steps, so that the pattern of the half lap joint via hole 11 is formed in the passivation layer 9 and the pattern of the full lap joint via hole 12 is formed in both the gate insulating layer 5 and the passivation layer 9, wherein the drain electrode 8 corresponds to a part of the half lap joint via hole 11, and the gate scanning pad region 10 corresponds to the whole of the full lap joint via hole 12.

Figure 8:
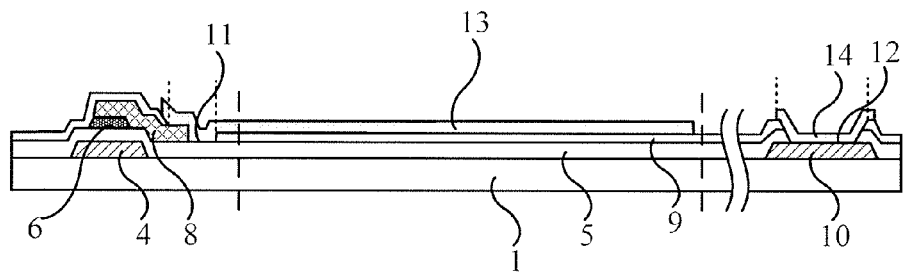
FIG. 8 is a fourth side view of a section of the array substrate produce by the first embodiment of the invention.

Step 600, forming patterns of a pixel electrode 13 and a gate line pad region connection line 14. First, depositing a pixel electrode film with transparent conductive material such as indium-tin oxide (ITO), and then forming the pattern of the pixel electrode 13 and the pattern of the gate line scanning pad region connection line 14 simultaneously with a patterning process. The pixel electrode 13 is formed on the surface of the drain electrode 8 and the gate insulating layer 5 through the half lap joint via holes 11, and the gate line scanning pad region connection line 14 is formed on the surface of the gate line pad region 10 through the full lap joint via holes 12, as shown in FIG. 8.

The first etching and the second etching can appropriately have a little bit longer etching time for over-etching, so as to assure the via holes can be successfully formed even in the case where the film is deposited inhomogeneously.

With the embodiment, the half lap joint via hole and the full lap joint via hole can be formed with two separate etching processes. It assures that the insulating material beneath the second conductive pattern is retained and no cavity is formed; it also makes it possible for the pixel electrode, which is deposited later, to be formed on the gate insulating layer and be connected to the drain electrode, which helps to avoid layer discontinuity. The above technique secures a via hole structure without any observable level step, which renders the characteristics of the products more stable, and can assure that the via holes in a pixel unit area be successfully formed, and thus further improves the quality of a TFT-LCD and the manufacturing efficiency and lowers the manufacturing cost.

Second Embodiment

The method of manufacturing an array substrate according to the second embodiment comprises the following steps:

Step 100, forming a pattern of a gate line pad region 10 on a base substrate 1, wherein the gate line pad region 10 is usually formed at the same time as patterns of a gate line 2 and a gate electrode 4 are formed.

Step 200, depositing a gate insulating layer 5 on the base substrate 1 with the above patterns formed thereon.

Step 300, forming a pattern of a drain electrode 8 on the base substrate 1 with the above patterns formed thereon, wherein in this step the patterns of an active layer 6, a data line 3, a source electrode 7, and etc. are also formed in the same time as the pattern of the drain electrode 8 is formed.

Step 400, depositing insulating material as a passivation layer 9 on the base substrate 1 with the above patterns formed thereon, as shown in FIG. 3 and FIG. 4.

The embodiment differs from the first embodiment in the following respects.

Step 511, applying a photoresist layer 40 on the passivation layer 9.

Figure 9:
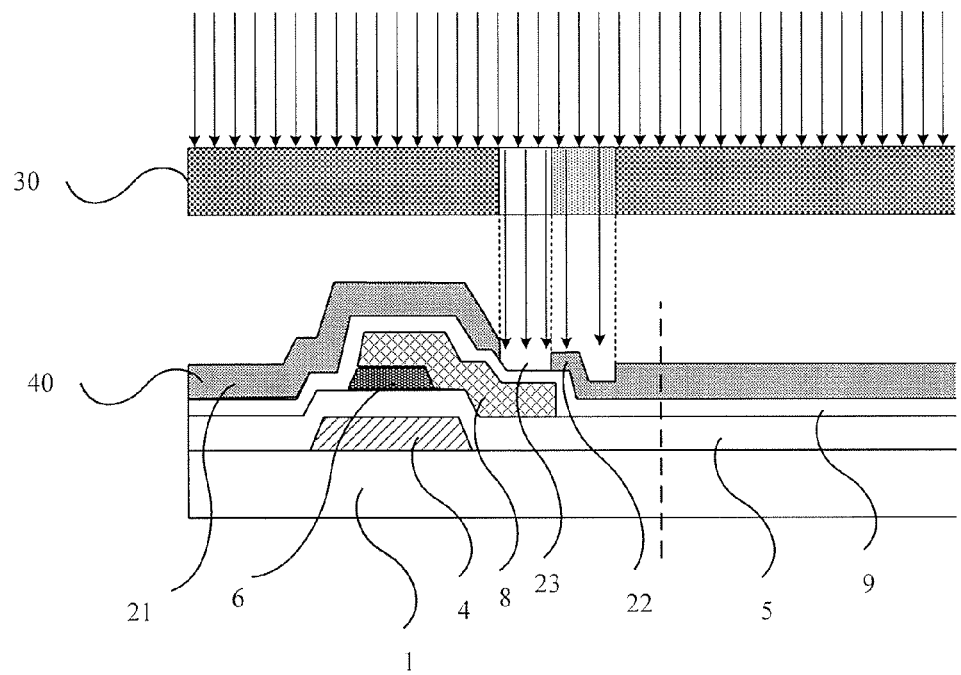
FIG. 9 is a first side view of a section of the array substrate produce by a second embodiment of the invention.

Step 512, exposing and developing the photoresist 40 with a double-tone mask 30 so as to form a pattern of the photoresist layer 40, which comprises a fully retained region 21, a partially retained region 22, and a completely removed region 23. The completely removed region 23 corresponds to the full lap joint via hole 12 and corresponds to a part of the half lap joint via hole 11 that is above the drain electrode 8, the partially retained region 22 corresponds to the remaining part of the half lap joint via hole 11; and the fully retained region 21 corresponds to the region other than the completely removed region 23 and the partially retained region 22, as shown in FIG. 5. FIG. 9 shows the enlarged structure at the half lap joint via hole 11.

Figure 10:
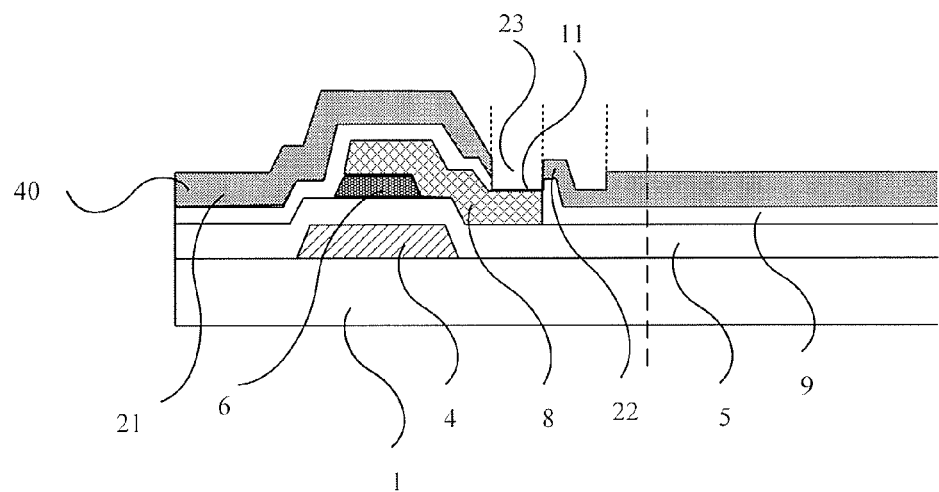
FIG. 10 is a second side view of a section of the array substrate produce by the second embodiment of the invention.

Step 513, performing a first etching to etch away at least the part of the passivation 9 that corresponds to the completely removed region 23, wherein it is preferable to etch away only the passivation layer, as shown in FIG. 6, in which case the insulating material in the half lap joint via hole 11 above the drain electrode 8 is etched away, as shown in FIG. 10.

Step 514, ashing the photoresist layer 40 in accordance with the thickness of the photoresist in the partially retained region 22.

Step 515, performing a second etching to etch away the part of the passivation layer 9 that corresponds to the partially retained region 22 and etch away the part of the gate insulating layer 5 that corresponds to the completely removed region 23 so as to form the half lap joint via hole 11 and the full lap joint via hole 12, as shown in FIG. 7.

Removing the photoresist layer 40 after the above steps, so that the pattern of the half lap joint via hole 11 is formed in the passivation layer 9 and the pattern of the full lap joint via hole 12 is formed in the gate insulating layer 5 and the passivation layer 9, wherein the drain electrode 8 corresponds to a part of the half lap joint via hole 11, and the gate scanning pad region 10 corresponds to the whole of the full lap joint via holes.

Step 600, forming patterns of a pixel electrode 13 and a gate line pad region connection line 14, wherein the pixel electrode 13 is formed on the surface of the drain electrode 8 and the gate insulating layer 5 through the half lap joint via holes 11, and the gate line scanning pad region connection line 14 is formed on the surface of the gate line pad region 10 through the full lap joint via holes 12, as shown in FIG. 8 and the top view of FIG. 1.

The technique of the embodiment has the same advantages with the first embodiment: the half lap joint via holes and the full lap joint via holes can be formed with two separate etching processes. It assures that the insulating material beneath the second conductive pattern is retained and no cavity is formed; it also makes it possible for the pixel electrode, which is deposited later, to be formed on the gate insulating layer and be connected to the drain electrode, which helps to avoid discontinuity. The above technique secures a via hole structure without any observable level step, which renders the characteristics of the products more stable, and can assure that the via holes in a pixel unit area be successfully formed, and thus further improves quality of a TFT-LCD and the manufacturing efficiency and lowers the manufacturing cost.

The aforementioned embodiments are the preferable ones, not the only ones. The invention can be implemented with different materials and processing parameters depending on different needs of product lines.

Figure 11:
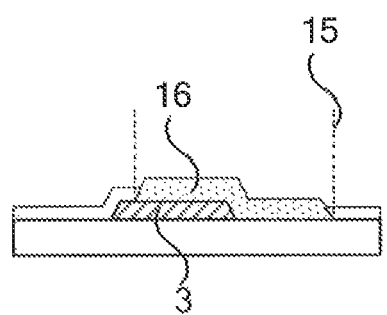
FIG. 11 is a side view of a section of the array substrate produced by an embodiment of the invention.

FIG. 11 is a side view of a section of the array substrate produced by an embodiment of the invention. The numerals 15 and 16 refer to "data line pad region" and "data line pad region" respectively.

Another embodiment further provides an array substrate. The array substrate comprises an array substrate and a plurality of pixel units formed on the array substrate. At least a first conductive pattern is formed on the base substrate and is covered by a first insulating layer; at least a second conductive pattern is formed on the first insulating layer and is covered by a second insulating layer; at least a third conductive pattern and a fourth conductive pattern are formed on the second insulating layer; at least a half lap joint via hole is formed in the second insulating layer, and at least a full lap joint via hole is formed in the first insulating layer and the second insulating layer, the second conductive pattern corresponds to a part of the half lap joint via hole, the first conductive pattern corresponds to the whole of the full lap joint via hole; the third conductivity pattern is formed on the surface of the second conductivity pattern and the first insulating layer through the half lap joint via hole, and the fourth conductive pattern is formed on the surface of the first conductive pattern through the full lap joint via hole.

Third Embodiment

The third embodiment is based on the structure described above for example. Typically, the first conductive pattern comprises a gate line pad region 10, the second conductive pattern comprises a drain electrode 8, the third conductive pattern comprises a pixel electrode 13, and the fourth conductive pattern comprises a connection line 14 for the gate line pad region connection line, as shown in FIG. 8.

The patterns may have other combinations. For example, the second conductive pattern can comprise a gate line pad region, and the third conductive pattern can comprises a data line pad region connection line.

The second conductive pattern can comprise data lines provided at intervals, and the third conductive pattern can comprise data line bridging lines.

The via holes in the data line pad regions can use the full lap joint structure, i.e., the data line pad regions are formed on the first insulating layer, full lap joint via holes are formed in the second insulating layer, data line pad region connection lines are formed on the second insulating layer, and the data line pad region connection lines are formed on the surface of the data line pad regions through the full lap joint via holes. The full lap joint via holes can correspond to, as necessary, the partially retained region or the completely removed region in a photoresist layer pattern.

The via holes of the data lines can use the full lap joint structure, i.e., the data lines, provided at intervals, are formed on the first insulating layer, full lap joint via holes are formed in the second insulating layer, data line bridging lines are formed on the second insulating layer, and the data line bridging lines are formed on the surface of the data lines via the full lap joint via hole. The full lap joint via holes can correspond to, as necessary, the partially retained region or the completely removed region in a photoresist layer pattern.

The array substrate according to an embodiment can be made by the method of manufacturing an array substrate, in which no cavity is formed below the second conductive pattern at the half lap joint structure; in the half lap joint structure, the third conductive pattern can be formed on the surface of the second conductive pattern and the first insulating layer below the second conductive pattern, which renders the pattern continuous and thus helps to avoid layer discontinuity.

Lastly, the aforementioned embodiments are employed to describe, not to limit, the technique. Notwithstanding that a detailed description is given with references to the aforementioned preferred embodiments, as one of ordinary skill in the art understands, the technique embodied in the aforementioned embodiments can be modified, or some technical features can be substituted with the equivalents; such modifications or substitutions do not deviate the nature of the technique from the spirit and scope of the technique embodied in the embodiments according to the invention.

What is claimed is:

1. A method of manufacturing an array substrate, comprising steps of:
    forming at least a first conductive pattern on a base substrate;
    forming a first insulating layer on the base substrate with the first conductive pattern formed thereon;
    forming at least a second conductive pattern on the first insulating layer;
    forming a second insulating layer on the base substrate with the second conductive pattern formed thereon;
    patterning the second insulating layer and the first insulating layer with a double-tone mask, forming at least a half lap joint via hole in the second insulating layer, and forming at least a full lap joint via hole in both the first insulating layer and the second insulating layer, wherein the second conductive pattern corresponds to a part of the half lap joint via hole, and the first conductive pattern corresponds to the whole of the full lap joint via hole; and
    forming at least a third conductive pattern and a fourth conductive pattern on the base substrate with the half lap joint via hole and the full lap joint via hole formed thereon, wherein the third conductivity pattern is formed on the surface of the second conductivity pattern and the first insulating layer through the half lap joint via hole, and the fourth conductive pattern is formed on the surface of the first conductive pattern through the full lap joint via hole;
    wherein patterning the second insulating layer and the first insulating layer with a double-tone mask comprises:
    applying a layer of photoresist on the second insulating layer;
    exposing and developing the photoresist with a double-tone mask, so as to form a pattern of the photoresist layer, which comprises a fully retained region, a partially retained region, and a completely removed region, wherein the completely removed region corresponds to the full lap joint via hole and corresponds to a part of the half lap joint via hole that is disposed on the drain electrode, the partially retained region corresponds to the remaining part of the half lap joint via hole, and the fully retained region corresponds to the region other than the completely removed region and the partially retained region, wherein the half lap joint via hole corresponds to a combination of the partially retained region and a part of the completely removed region;
    performing a first dry etching to etch away at least the part of the second insulating layer that corresponds to the completely removed region and expose the drain electrode corresponding to the part of the half lap joint via hole;
    aching the photoresist in accordance with the thickness of the photoresist in the partially retained region and expose the second insulating layer corresponding to the remaining part of the half lap joint via hole; and
    performing a second dry etching to etch away the part of the second insulating layer to expose the first insulating layer that corresponds to the remaining part of the half lap joint via hole and to etch away the part of the first insulating layer that corresponds to the completely removed region, so as to form the half lap joint via hole and the full lap joint via hole.

2. The method of manufacturing an array substrate according to claim 1, wherein
    the first conductive pattern comprises a pattern of a gate line pad region,
    the second conductive pattern comprises a pattern of a drain electrode, a data line pad region, and/or a data line;
    the third conductive pattern comprises a pattern of a pixel electrode, a data line pad region, and/or data line bridging lines; and
    the fourth conductive pattern comprises a pattern of a gate line pad region connection line.

3. The method of manufacturing an array substrate according to claim 1, wherein
    the first conductive pattern comprises a pattern of a gate line pad region,
    the second conductive pattern comprises a pattern of a drain electrode, a data line pad region, and/or a data line;
    the third conductive pattern comprises a pattern of a pixel electrode, a data line pad region, and/or data line bridging lines; and
    the fourth conductive pattern comprises a pattern of a gate line pad region connection line.

4. The method of manufacturing an array substrate according to claim 1, wherein
    a data line pad region is also formed when a drain electrode and/or a data line is formed as the second conductive layer;
    a pattern of a full lap joint via hole is also formed in the second insulating layer when patterning the second insulating layer and the first insulating layer with the double-tone mask, wherein the data line pad regions correspond to the full lap joint via hole; and
    a pattern of a data line pad region connection line is also formed when forming the third conductive patterns and the fourth conductive pattern on the base substrate, wherein the data line pad region connection line is formed on the surface of the data line pad region through the full lap joint via hole.

5. The method of manufacturing an array substrate according to claim 1, wherein
    a data line pad region is also formed when a drain electrode and/or a data line is formed as the second conductive layer;
    a pattern of a full lap joint via hole is also formed in the second insulating layer when patterning the second insulating layer and the first insulating layer with the double-tone mask, wherein the data line pad regions correspond to the full lap joint via hole;

a pattern of a data line pad region connection line is also formed when forming the third conductive patterns and the fourth conductive pattern on the base substrate, wherein the data line pad region connection line is formed on the surface of the data line pad region through the full lap joint via hole.

6. An array substrate made by using the method according to claim 1.

* * * * *